(12) United States Patent
Cai (10) Patent No.: US 9,384,891 B2
(45) Date of Patent: Jul. 5, 2016

(54) METHOD AND SYSTEM FOR A METAL FINGER CAPACITOR WITH A TRIPLET REPEATING SEQUENCE INCORPORATING A METAL UNDERPASS

(71) Applicant: Maxlinear, Inc., Carlsbad, CA (US)

(72) Inventor: Weizhong Cai, Carlsbad, CA (US)

(73) Assignee: Maxlinear, Inc., Carlsbad, CA (US)

( * ) Notice: Subject to any disclaimer, the term of this patent is extended or adjusted under 35 U.S.C. 154(b) by 44 days.

(21) Appl. No.: 14/319,747

(22) Filed: Jun. 30, 2014

(65) Prior Publication Data

US 2015/0054126 A1 Feb. 26, 2015

Related U.S. Application Data (60) Provisional application No. 61/868,583, filed on Aug. 22, 2013.

(51) Int. Cl.
| | |
|---|---|
| H01L 21/02 | (2006.01) |
| H01G 4/002 | (2006.01) |
| H01L 23/522 | (2006.01) |
| H01G 4/005 | (2006.01) |
| H01G 4/228 | (2006.01) |
| H01L 49/02 | (2006.01) |

(52) U.S. Cl.
CPC ............... *H01G 4/002* (2013.01); *H01G 4/005* (2013.01); *H01G 4/228* (2013.01); *H01L 23/5223* (2013.01); H01L 28/88 (2013.01); H01L 28/92 (2013.01); H01L 2924/0002 (2013.01)

(58) Field of Classification Search
USPC .......................................... 257/532; 438/381
See application file for complete search history.

(56) References Cited

U.S. PATENT DOCUMENTS

| | | | | |
|---|---|---|---|---|
| 7,471,500 | B1 * | 12/2008 | Chen ...................... | H01G 4/228 361/306.1 |
| 8,432,662 | B2 * | 4/2013 | Sasaki .................... | H01G 4/008 361/303 |
| 8,462,482 | B2 * | 6/2013 | Sasaki .................... | H01G 4/008 361/301.1 |
| 8,582,276 | B2 * | 11/2013 | Chen ................... | H01L 23/5223 361/301.1 |
| 8,836,138 | B2 * | 9/2014 | Fujii ..................... | H05K 1/0251 257/773 |
| 2003/0148578 | A1 * | 8/2003 | Ku ....................... | H01L 23/5223 438/239 |
| 2010/0061036 | A1 * | 3/2010 | Harris ................. | H01L 23/5223 361/303 |
| 2010/0125989 | A1 * | 5/2010 | Huang .................... | H01G 4/33 29/25.42 |
| 2013/0062778 | A1 * | 3/2013 | Fujii .................... | H05K 1/0251 257/774 |
| 2013/0334658 | A1 * | 12/2013 | Cai ........................ | H01L 28/40 257/532 |

* cited by examiner

*Primary Examiner* — Telly Green
(74) *Attorney, Agent, or Firm* — McAndrews, Held & Malloy (57) ABSTRACT

Methods and systems for a metal finger capacitor with a triplet repeating sequence incorporating a metal underpass may comprise repeating triplet capacitors integrated on a semiconductor die. The capacitors may comprise a first set of interconnected metal fingers comprising a first terminal of a first capacitor, a second set of interconnected metal fingers comprising a first terminal of a second capacitor, and a third set of interconnected metal fingers comprising a common node that surrounds the first and second sets of interconnected metal fingers. The common node may comprise a second terminal of the capacitors. A repeating pattern of fingers may be: (third set/second set/third set/first set . . . ). The repeating pattern of metal fingers may be arranged in two parallel rows to mitigate variations in the semiconductor die. The interconnected metal fingers may comprise first and second metal layers formed on the semiconductor die.

20 Claims, 7 Drawing Sheets

METHOD AND SYSTEM FOR A METAL FINGER CAPACITOR WITH A TRIPLET REPEATING SEQUENCE INCORPORATING A METAL UNDERPASS

CROSS-REFERENCE TO RELATED APPLICATIONS/INCORPORATION BY REFERENCE

This application makes reference to and claims priority to U.S. Provisional Application Ser. No. 61/868,583 filed on Aug. 22, 2013. The above identified application is hereby incorporated herein by reference in its entirety.

FIELD

Certain embodiments of the disclosure relate to semiconductor devices. More specifically, certain embodiments of the disclosure relate to a method and system for a metal finger capacitor with a triplet repeating sequence incorporating a metal underpass.

BACKGROUND

Complementary metal oxide semiconductor (CMOS) transistors are ubiquitous in today's electronics devices. As more devices are being integrated onto CMOS chips, capacitors have moved from being board-mounted discrete devices to being integrated on the chip. However, higher capacitances require large areas and suffer from mismatch issues due to process variations.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method for a metal finger capacitor with a triplet repeating sequence incorporating a metal underpass substantially as shown in and/or described in connection with at least one of the figures, as set forth more completely in the claims.

Various advantages, aspects and novel features of the present disclosure, as well as details of an illustrated embodiment(s), will be more fully understood from the following description and drawings.

BRIEF DESCRIPTION OF SEVERAL VIEWS OF THE DRAWINGS

FIGS. 1A-1D illustrate an on-chip capacitor, in accordance with an example embodiment of the disclosure.

DETAILED DESCRIPTION

Certain aspects of the disclosure may be found in a metal finger capacitor with a triplet repeating sequence incorporating a metal underpass. Exemplary aspects of the disclosure may comprise repeating triplet capacitors integrated on a semiconductor die. The repeating triplet capacitors may comprise a first set of interconnected metal fingers comprising a first terminal of a first capacitor, a second set of interconnected metal fingers comprising a first terminal of a second capacitor, and a third set of interconnected metal fingers comprising a common node that surrounds the first and second sets of interconnected metal fingers. The common node may comprise a second terminal of both the first and second capacitors. A repeating pattern of interconnected metal fingers of the first, second, and third set of the interconnected metal fingers may be: (third set/second set/third set/first set . . . ). The repeating pattern of metal fingers may be arranged in two parallel rows to mitigate variations in the semiconductor die. The first, second, and third sets of interconnected metal fingers may comprise first and second metal layers formed on the semiconductor die. The common node may comprise a metal underpass formed under the first, second, and third sets of metal fingers. The metal underpass may comprise a third metal layer formed on the semiconductor die under the first and second metal layers. The metal underpass may be formed underneath and parallel to the first and second sets of interconnected metal fingers. The first and second metal layers may be embedded in a dielectric material formed on the semiconductor die. The common node may be on all four sides of the repeating triplet capacitors. The semiconductor die may comprise a complementary metal oxide semiconductor (CMOS) die.

As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the terms "block" and "module" refer to functions than can be implemented in hardware, software, firmware, or any combination of one or more thereof. As utilized herein, the term "exemplary" means serving as a non-limiting example, instance, or illustration. As utilized herein, the term "e.g.," introduces a list of one or more non-limiting examples, instances, or illustrations.

Figures 1A, 1D:
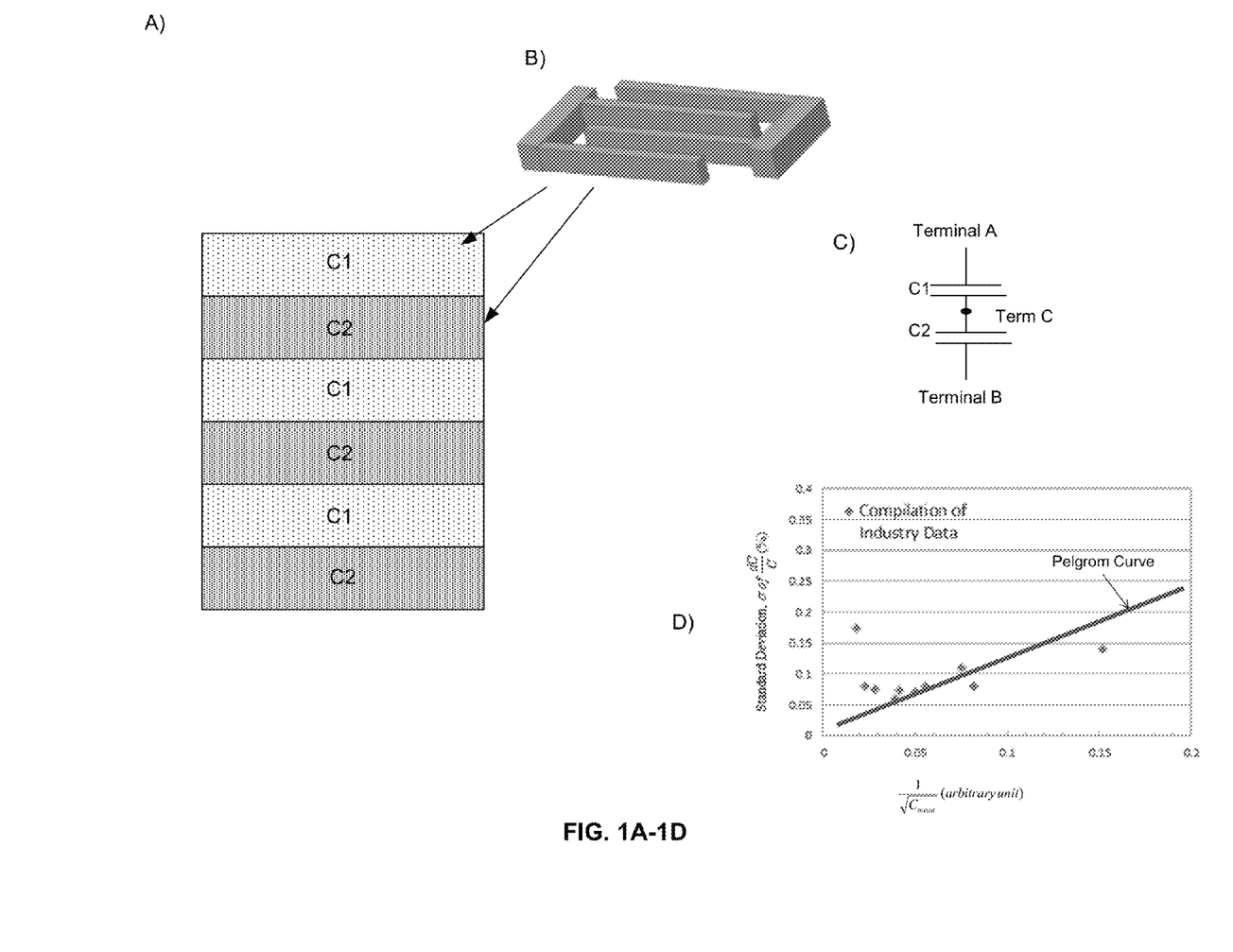

FIGS. 1A-1D illustrate an on-chip capacitor, in accordance with an example embodiment of the disclosure. Referring to FIG. 1A, there is shown an on-chip capacitor circuit comprising capacitors C1 and C2. The conventional architecture shown with capacitor elements comprising interdigitated fingers situated side-by-side requires a large area of the die, which also leads to excessive mismatch due to wafer processing variations over such large areas.

An oblique view of an example cell of the C and C2 capacitor structures is shown in FIG. 1B, illustrating the repeating sections of the capacitors, as indicated by the individual squares of FIG. 1A. A schematic of the capacitors from the on-chip capacitor structure is shown in FIG. 1C, with a common terminal C for both C1 and C2.

Typical complementary metal oxide semiconductor (CMOS) processing technology renders metal-oxide-metal (MOM) capacitors subject to cross-wafer processing gradients. The percentage difference in capacitance is given by:

$$\frac{\Delta C}{C_{mean}} = \frac{C_1 - C_2}{\frac{1}{2} \cdot (C_1 + C_2)}$$

The plot of FIG. 1D shows measured mismatch data that deviates from the classical Pelgrom curve as shown by the solid line. The plot illustrates the increased capacitor mismatch at higher capacitance values, i.e., larger areas. The length-to-width ratio for MOM capacitors may be very large, 2-40 microns/50 nanometers, for example. Therefore, MOM capacitors may be quite susceptible to process variability, both systematic and random, along the x- and y-directions. Modern CMOS processes such as photolithography and chemical-mechanical polishing (CMP) may contribute to such variability.

Figure 2A:
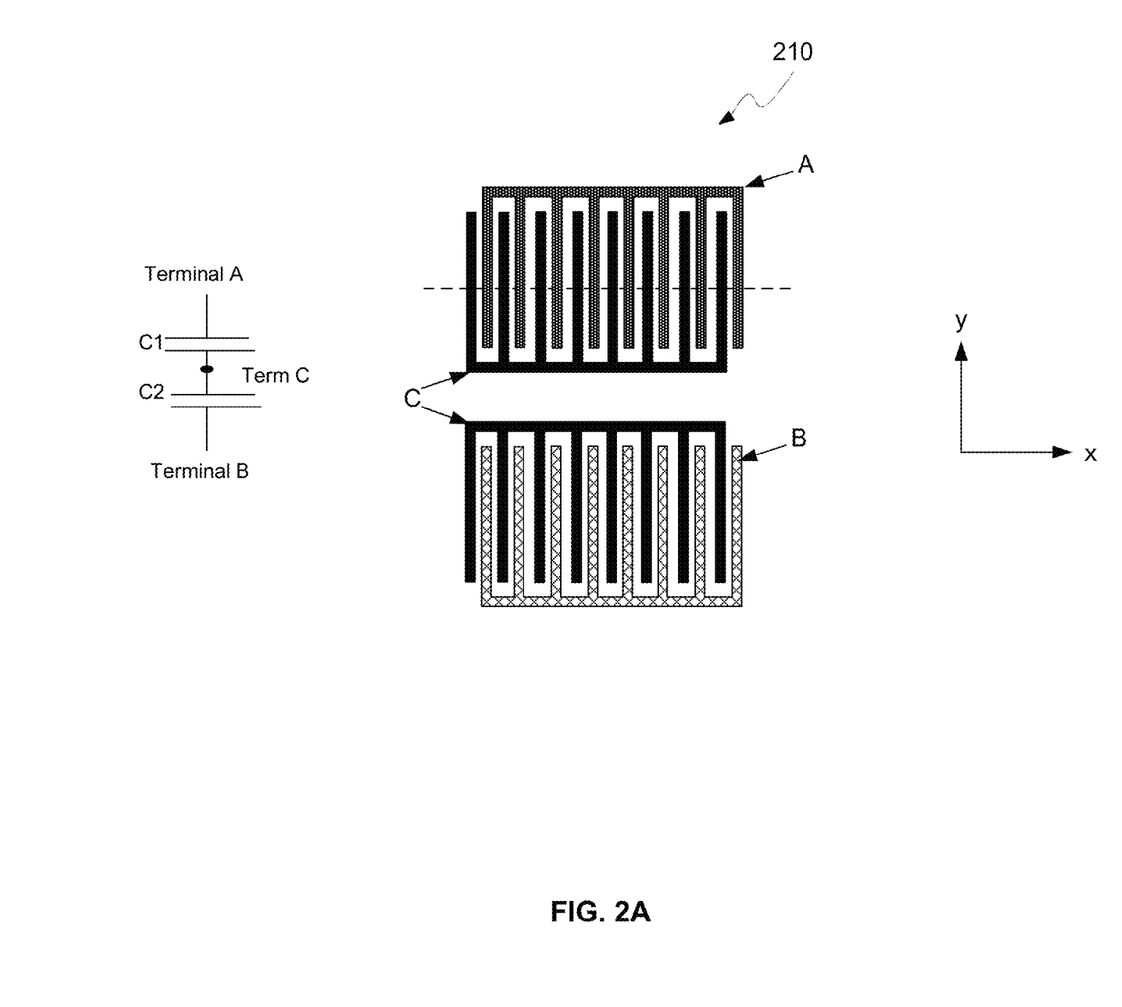
FIG. 2A illustrates a conventional on-chip capacitor, in accordance with an example embodiment of the disclosure.

FIG. 2A illustrates a conventional on-chip capacitor, in accordance with an example embodiment of the disclosure. Referring to FIG. 2A, there is shown a conventional capacitor 210 comprising A, B, and C terminals, with an upper cell comprising A and C terminals and a lower cell comprising B and C terminals. These doublet cells may be repeated in the x-direction, and have reflection symmetry in the y-direction, i.e., the doublets are rotated 180 degrees from each other. The resulting repeating pattern is CACACACA . . . for the top capacitor and CBCBCBCB . . . for the bottom capacitor, where C is a common terminal coupled outside the cell shown in FIG. 2A.

A disadvantage of this structure is that the CA and CB capacitors are not identical due to variations or gradients along the y-direction. The dashed line in FIG. 2A indicates the location of the cross-sectional view shown in FIG. 5.

Figure 2B:
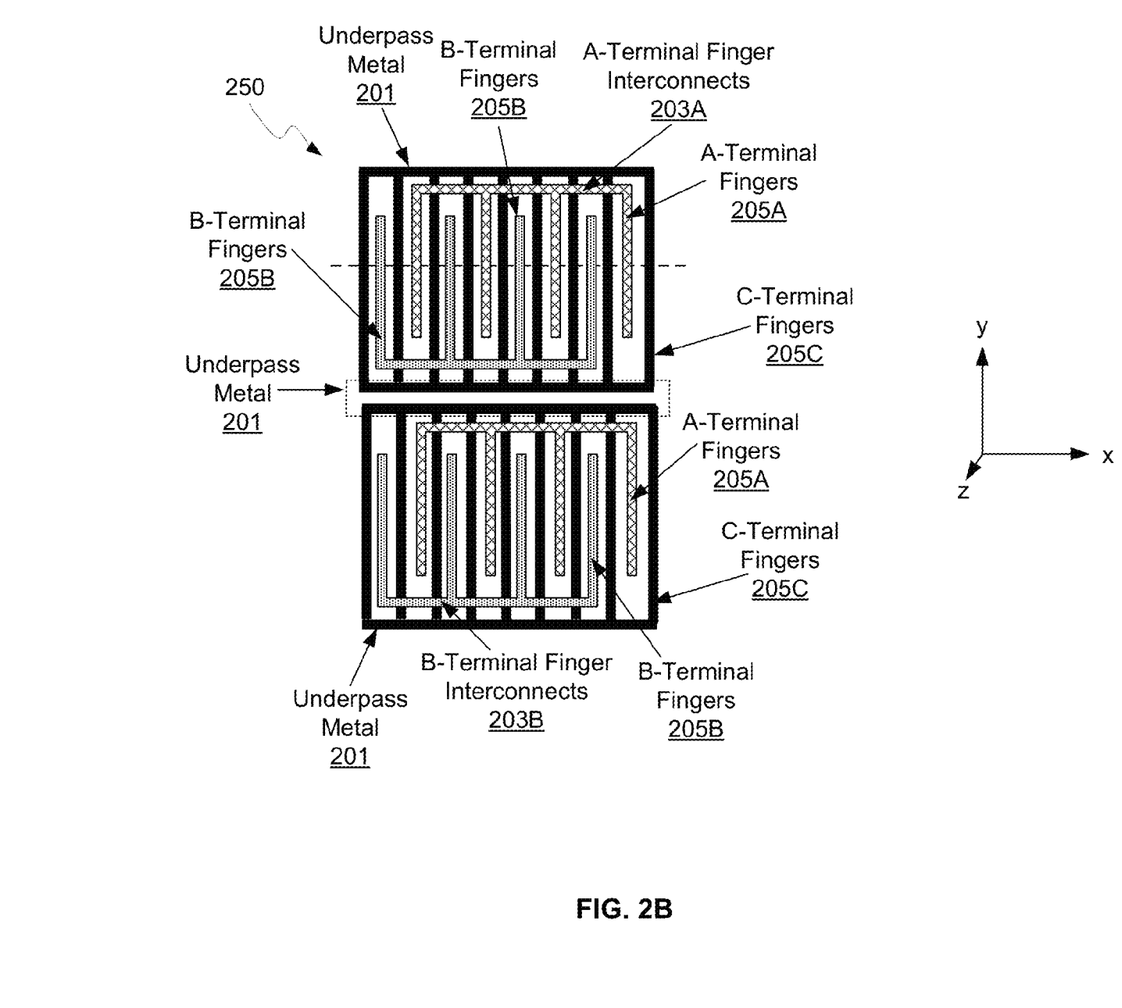
FIG. 2B illustrates a triplet unit cell on-chip capacitor, in accordance with an example embodiment of the disclosure.

FIG. 2B illustrates a triplet unit cell on-chip capacitor, in accordance with an example embodiment of the disclosure. A triplet repeating cell 250 is illustrated in FIG. 2B, where the triplet cell comprises A-terminal fingers 205A, B-terminal fingers 205B, and C-terminal fingers 205C. The A-terminal fingers 205A may be electrically connected by the A-terminal finger interconnects 203A and the B-terminal fingers 205B may be electrically connected by the B-terminal finger interconnects 203B. The interdigitated fingers in each repeating cell may be arranged so that the repeating pattern is CBCACBCACBCA . . . for each row of repeating cells. This averages out the variability along the y-direction and eliminates the need for a centroid layout, which may lead to parasitic capacitance that is difficult to estimate prior to layout finalization. It should be noted that the A, B, C nomenclature is merely arbitrary, and is not used to indicate a preferred order, for example.

In FIG. 2B, the underpass metal 201, which may act as an electrical interconnect for the C-terminal fingers 205C, is drawn outside of the A-terminal finger interconnects 203A and the B-terminal finger interconnects 203B on the top and bottom boundaries of the cells for simplicity in the drawing. In an example scenario, the horizontal portions, the underpass metal 201, for connecting the C-terminal fingers 205C, may be directly beneath the A-terminal finger interconnects 203A and the B-terminal finger interconnects 203B, reducing and/or eliminating parasitic capacitance to the substrate. In another example scenario, the C-terminal fingers 205C may be coplanar, i.e., in the same x-y plane, between the A-terminal fingers 205A and B terminal fingers 205B as shown in FIG. 2B, and electrically connected to the underpass metal 201 below the plane of the A-terminal finger interconnects 203A and the B-terminal finger interconnects 203B, resulting in a metal underpass for electric field termination in the z-direction, as shown further with respect to FIG. 6. This electric field termination in the z-direction may reduce parasitic capacitance to the substrate.

The triplet repeating cell 250 illustrates a finger array with the common node C comprising the solid black outline on all four sides, comprising the outer C-terminal fingers 205C and the underpass metal 201, which may also reduce parasitic capacitance from nearby structures because the electric-field lines may terminate on the common node C in all directions. The dashed line in FIG. 2B indicates the location of the cross-sectional view shown in FIG. 6.

Figure 3:
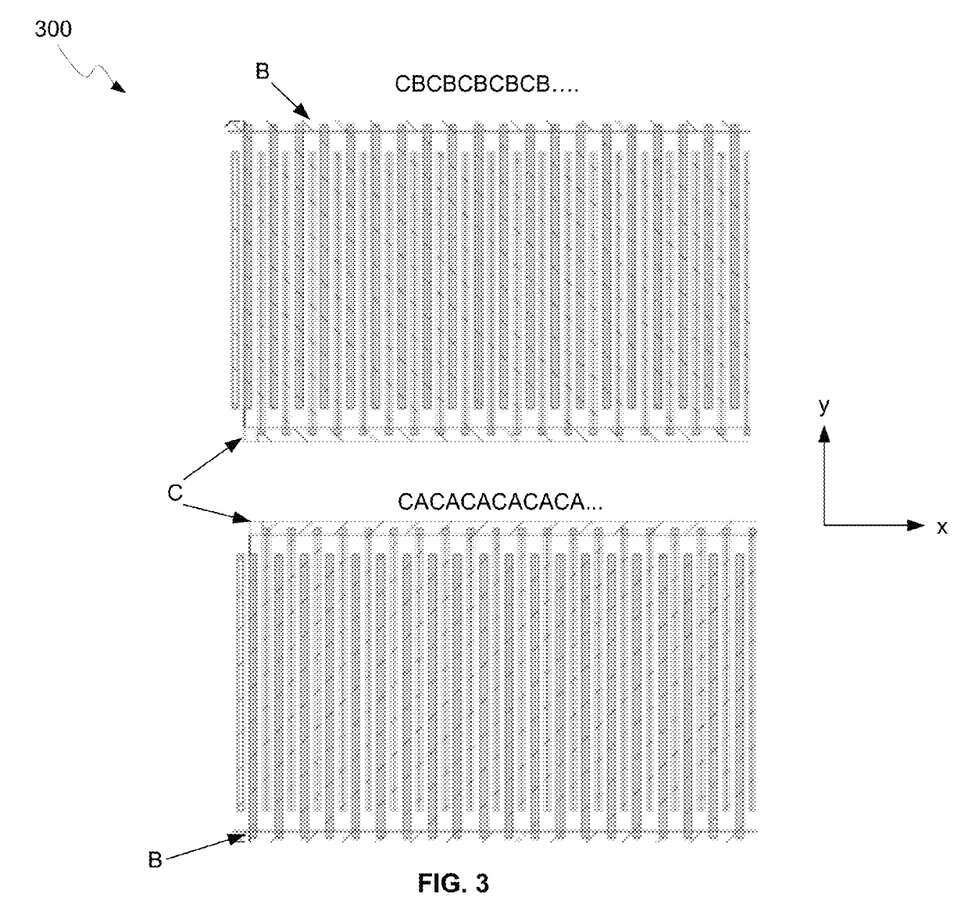
FIG. 3 is a diagram illustrating a metal pattern layout for a conventional capacitor structure, in accordance with an example embodiment of the disclosure.

FIG. 3 is a diagram illustrating a metal pattern layout for a conventional capacitor structure, in accordance with an example embodiment of the disclosure. Referring to FIG. 3, there is shown a conventional capacitor metal layout 300 comprising an upper repeating cell with a CBCBCBCB . . . repeating pattern and a lower row comprising a CACACA . . . repeating pattern. The common node C is shown along with A and B terminals of the capacitor.

The conventional capacitor metal layout 300 may result in a C2/C1 ratio of 1, meaning C1 and C2 are intended to be nominally equal. However, due to process/wafer variations in the y-direction, C1 is different from C2, adversely affecting circuit performance.

Figure 4:
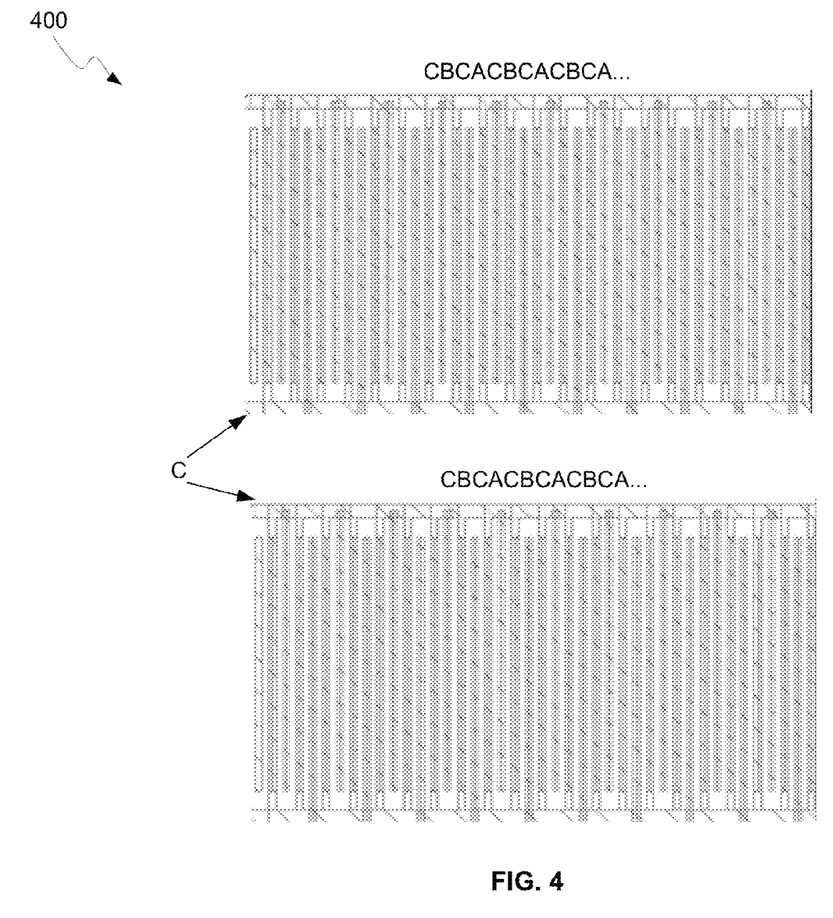
FIG. 4 is a diagram illustrating a triplet unit cell capacitor structure, in accordance with an example embodiment of the disclosure.

FIG. 4 is a diagram illustrating a metal pattern layout for a triplet unit cell structure, in accordance with an example embodiment of the disclosure. Referring to FIG. 4, the layout illustrates a triplet unit cell structure 400 with both the upper and lower repeating patterns comprising CBCACBCACBCA . . . such that both A and B terminals are present in all unit cells meaning that both A and B terminals are subjected to the same variations across the x- and y-directions, cancelling out capacitance variations. This repeating pattern illustrates a C2/C1 ratio of 1, but the disclosure is not necessarily so limited. The A to B patterns in the unit cell may be varied to configure the C2/C1 ratio, such as with a CBCACACBCACA . . . pattern, for example. The triplet repeating cell may thus be utilized to create metal finger capacitors with better matching than conventional structures.

The common node C may comprise an underpass metal that may route out the common node. The triplet unit cell structure 400 comprises two rows of finger arrays with the common node C on all four sides, but because FIG. 4 does not illustrate an entire cell layout, the common node C is not visible on all four sides in this view.

By incorporating the common node C on all four sides of the cell, parasitic capacitance may be reduced or eliminated from the substrate or other nearby structures because the electric-field lines may terminate on the common node C in all directions.

Figure 5:
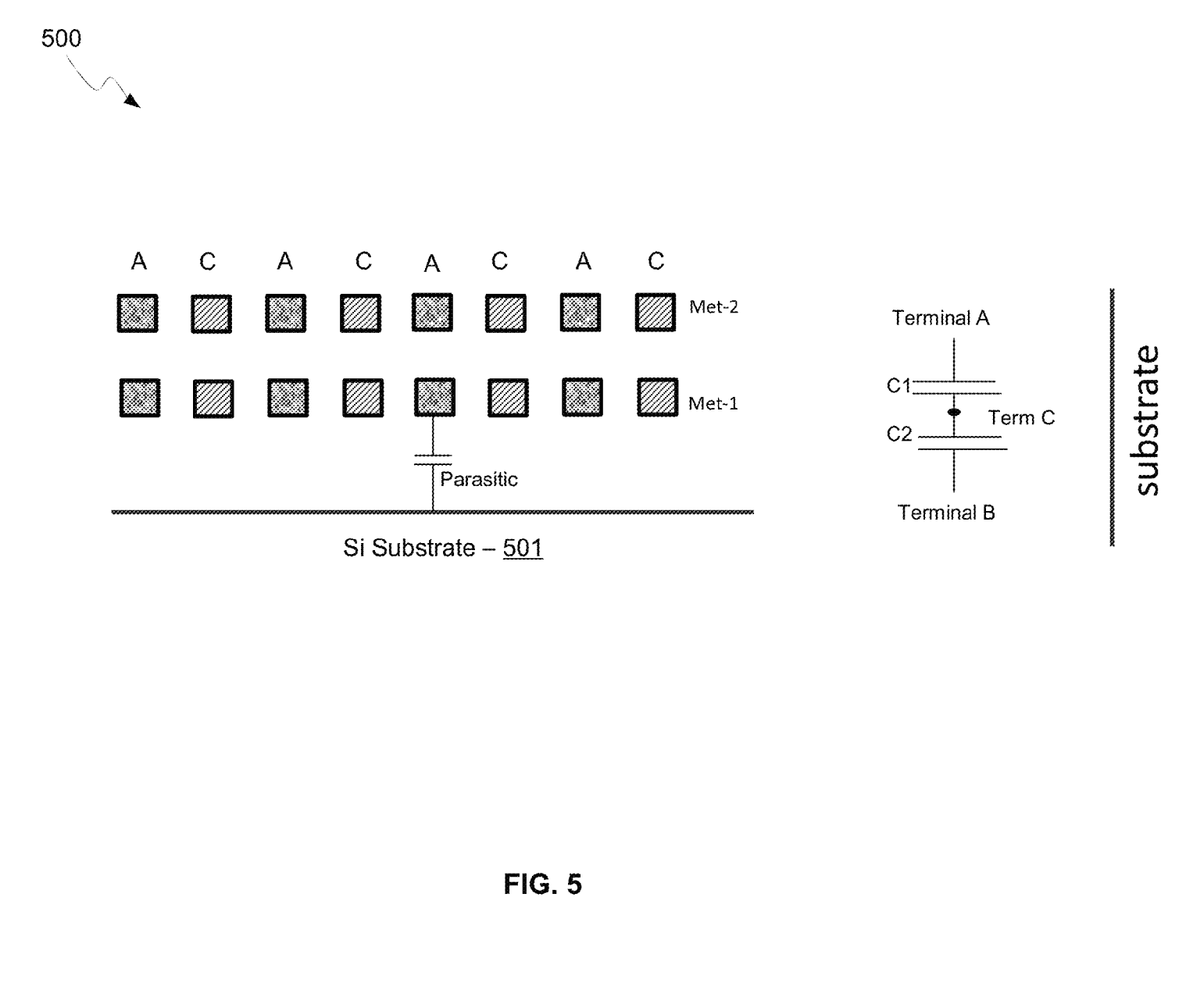
FIG. 5 is a diagram illustrating a cross-sectional view of a conventional capacitor structure, in accordance with an example embodiment of the disclosure.

FIG. 5 is a diagram illustrating a cross-sectional view of a conventional capacitor structure, in accordance with an example embodiment of the disclosure. Referring to FIG. 5, there is shown a capacitor structure 500 comprising two metal layers, labeled Met-1 and Met-2, formed over a silicon substrate 501. The metal layers may be formed of a similar material or different materials, and may be embedded in a dielectric or semiconductor material, such as silicon, for example.

The Met-1 and Met-2 layers may be coupled together using vias extending vertically (not shown here, but shown for common node C in FIG. 6) between the layers. While the schematic to the right shows two capacitors, C1 and C2, only C1 is shown in this cross-section defined by the dashed line in FIG. 2A, because C2 would be out of the plane of this figure. A similar cross-section would apply to the second capacitor with B and C terminals/nodes.

The parasitic capacitance to the substrate, as shown in FIG. 5, may be significant with this structure, because electric field lines may terminate at the substrate as opposed to being entirely terminated on the common node C, depending on the voltage between A and C, distance of the Met-1 layer to the substrate, and substrate conductivity, for example.

Figure 6:
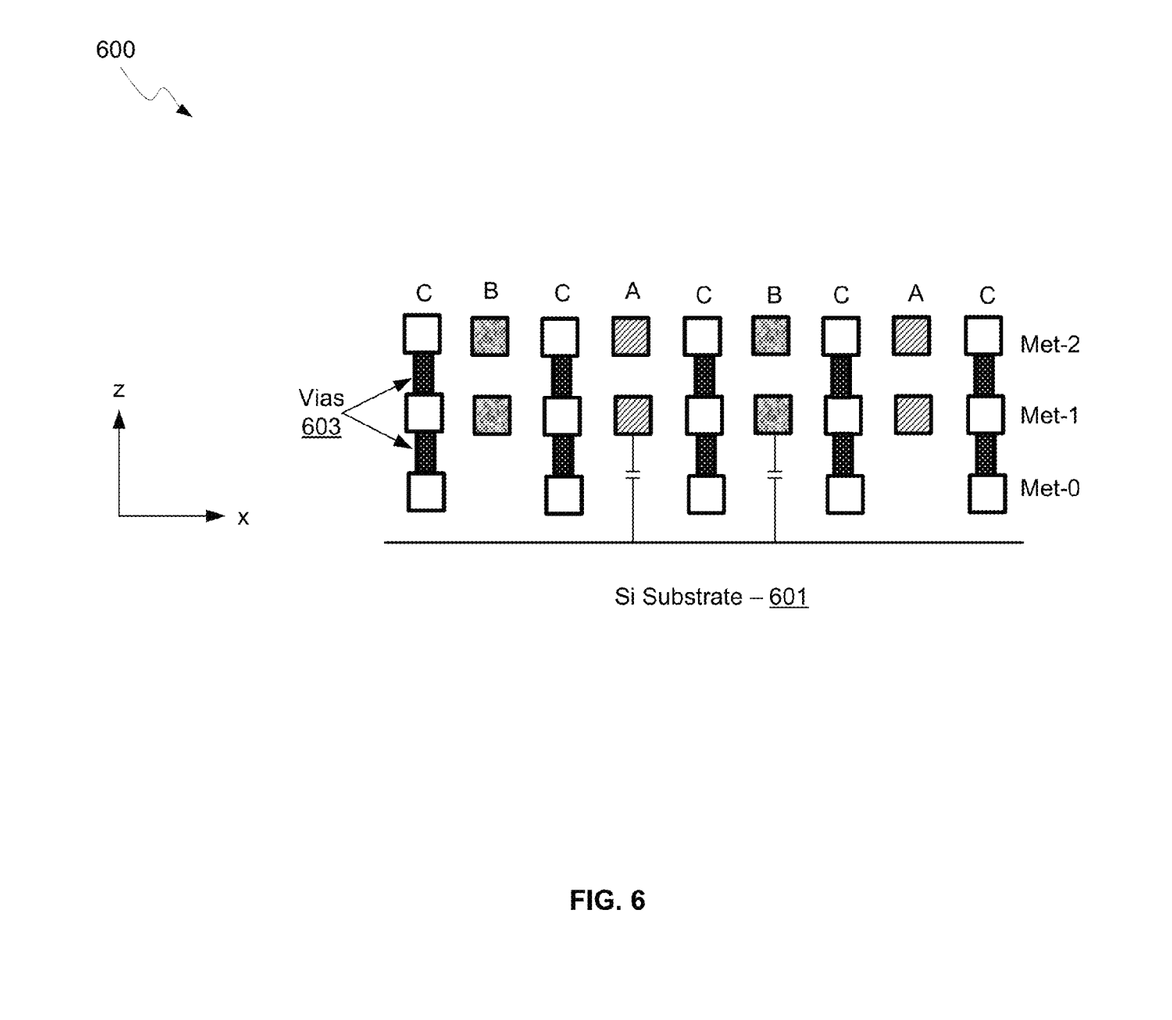
FIG. 6 is a diagram illustrating a cross-sectional view of a triplet unit cell capacitor structure, in accordance with an example embodiment of the disclosure.

FIG. 6 is a diagram illustrating a cross-sectional view of a triplet unit cell capacitor structure, in accordance with an example embodiment of the disclosure. Referring to FIG. 6, there is shown a capacitor structure 600 comprising three metal layers, labeled Met-0, Met-1, and Met-2, formed over a silicon substrate 601. The metal layers may be formed from a similar material or different materials, and may be embedded in a dielectric or semiconductor material, such as silicon dioxide or silicon, for example. The A and B terminals labeled A and B in FIG. 6 correspond to the A-terminal fingers 205A and B-terminal fingers 205B and the common node C may correspond to the C-terminal fingers 205C, described with respect to FIG. 2B.

The Met-0, Met-1, and Met-2 layers may be coupled together using vias 603 extending vertically between the layers for the common node C, as shown, and also between Met-1 and Met-2 layers for the A and B terminals. The latter vias are not shown in FIG. 6, as they may be located at the edges of the cell, and not at the dashed line of FIG. 2B that defines the cross-section shown in FIG. 6. The vias 603 may comprise electrically conductive material, such as a metal, that fills a hole formed in the material surrounding the Met-0, Met-1, and Met-2 layers.

The parasitic capacitances to the substrate, shown in FIG. 6, may be reduced or eliminated with this triplet structure, because electric field lines may terminate entirely on the common node C, which essentially surrounds the A and B terminals in this configuration. Furthermore, with the underpass metal, Met-0, extending the entire cell length in the x-direction, as shown by the underpass metal 201 in FIG. 2B, it may also terminate the field lines for the entire structure, as opposed to terminating at the substrate 601.

In an embodiment of the disclosure, a method and system may comprise repeating triplet capacitors integrated on a semiconductor die. The repeating triplet capacitors may comprise a first set of interconnected metal fingers comprising a first terminal of a first capacitor, a second set of interconnected metal fingers comprising a first terminal of a second capacitor, and a third set of interconnected metal fingers comprising a common node that surrounds the first and second sets of interconnected metal fingers. The common node may comprise a second terminal of both the first and second capacitors.

A repeating pattern of interconnected metal fingers of the first, second, and third set of the interconnected metal fingers may be: (third set/second set/third set/first set . . . ). The repeating pattern of metal fingers may be arranged in two parallel rows to mitigate variations in the semiconductor die. The first, second, and third sets of interconnected metal fingers may comprise first and second metal layers formed on the semiconductor die. The common node may comprise a metal underpass formed under the first, second, and third sets of metal fingers.

The metal underpass may comprise a third metal layer formed on the semiconductor die under the first and second metal layers. The metal underpass may be formed underneath and parallel to the first and second sets of interconnected metal fingers. The first and second metal layers may be embedded in a dielectric material formed on the semiconductor die. The common node may be on all four sides of the repeating triplet capacitors. The semiconductor die may comprise a complementary metal oxide semiconductor (CMOS) die.

Other embodiments may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for a metal finger capacitor with a triplet repeating sequence incorporating a metal underpass.

Accordingly, aspects of the disclosure may be realized in hardware, software, firmware or a combination thereof. The disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

Aspects of the present disclosure may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present disclosure.

While the disclosure references certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present invention not be limited to the particular embodiments disclosed, but that the present invention will include all embodiments falling within the scope of the appended claims.

What is claimed is:

1. A semiconductor device, the device comprising:
   repeating triplet capacitors integrated on a semiconductor die, the repeating triplet capacitors comprising:

a first set of interconnected metal fingers comprising a first terminal of a first capacitor;

a second set of interconnected metal fingers comprising a first terminal of a second capacitor; and a third set of interconnected metal fingers comprising a common node that surrounds each finger of the first and second sets of interconnected metal fingers and comprises a second terminal of both the first and second capacitors.

2. The semiconductor device according to claim 1, wherein a repeating pattern of interconnected metal fingers of the first, second, and third set of the interconnected metal fingers is: (third set/second set/third set/first set . . . ).

3. The semiconductor device according to claim 1, wherein the repeating pattern of metal fingers is arranged in two parallel rows to mitigate variations in the semiconductor die.

4. The semiconductor device according to claim 1, wherein the first, second, and third sets of interconnected metal fingers comprise first and second metal layers formed on the semiconductor die.

5. The semiconductor device according to claim 4, wherein the common node comprises a metal underpass formed under the first, second, and third sets of metal fingers.

6. The semiconductor device according to claim 5, wherein the metal underpass comprises a third metal layer formed on the semiconductor die under the first and second metal layers.

7. The semiconductor device according to claim 5, wherein the metal underpass is formed underneath and parallel to the first and second sets of interconnected metal fingers.

8. The semiconductor device according to claim 4, wherein the first and second metal layers are embedded in a dielectric material formed on the semiconductor die.

9. The semiconductor device according to claim 1, wherein the common node is on all four sides of the repeating triplet capacitors.

10. The semiconductor device according to claim 1, wherein the semiconductor die comprises a complementary metal oxide semiconductor (CMOS) die.

11. A method for forming a semiconductor device, the method comprising:

in a semiconductor die, forming repeating triplet capacitors by:

forming a first set of interconnected metal fingers comprising a first terminal of a first capacitor;

forming a second set of interconnected metal fingers comprising a first terminal of a second capacitor; and forming a third set of interconnected metal fingers comprising a common node that surrounds each finger of the first and second sets of interconnected metal fingers and comprises a second terminal of both the first and second capacitors.

12. The method according to claim 11, wherein a repeating pattern of interconnected metal fingers of the first, second, and third set of the interconnected metal fingers is: (third set/second set/third set/first set . . . ).

13. The method according to claim 11, comprising mitigating variations in the semiconductor die by forming the repeating pattern of metal fingers in two parallel rows.

14. The method according to claim 11, wherein the first, second, and third sets of interconnected metal fingers comprise first and second metal layers formed on the semiconductor die.

15. The method according to claim 14, wherein the common node comprises a metal underpass formed under the first, second, and third sets of metal fingers.

16. The method according to claim 15, wherein the metal underpass comprises a third metal layer formed on the semiconductor die under the first and second metal layers.

17. The method according to claim 15, comprising forming the metal underpass underneath and parallel to the first and second sets of interconnected metal fingers.

18. The method according to claim 14, wherein the first and second metal layers are embedded in a dielectric material formed on the semiconductor die.

19. The method according to claim 11, wherein the common node is on all four sides of the repeating triplet capacitors.

20. A semiconductor device comprising:

repeating triplet capacitors formed on a semiconductor die, the repeating triplet capacitors comprising two rows of:

a first set of interconnected metal fingers comprising a first terminal of a first capacitor;

a second set of interconnected metal fingers comprising a first terminal of a second capacitor; and a third set of interconnected metal fingers comprising a common node that surrounds each finger of the first and second sets of interconnected metal fingers and comprises a second terminal of both the first and second capacitors.

* * * * *